United States Patent
Lai

(10) Patent No.: US 10,418,086 B2
(45) Date of Patent: Sep. 17, 2019

(54) VOLATILE MEMORY STORAGE APPARATUS AND REFRESH METHOD THEREOF

(71) Applicant: Winbond Electronics Corp., Taichung (TW)

(72) Inventor: Chih-Jing Lai, Taichung (TW)

(73) Assignee: Windbond Electronics Corp., Taichung (TW)

(*) Notice: Subject to any disclaimer, the term of this patent is extended or adjusted under 35 U.S.C. 154(b) by 0 days.

(21) Appl. No.: 15/981,922

(22) Filed: May 17, 2018

(65) Prior Publication Data
US 2019/0115069 A1   Apr. 18, 2019

(30) Foreign Application Priority Data
Oct. 12, 2017   (CN) ............ 2017 1 0945107

(51) Int. Cl.
G11C 7/00         (2006.01)
G11C 11/406      (2006.01)
G06F 13/16       (2006.01)
G11C 11/409      (2006.01)

(52) U.S. Cl.
CPC .... G11C 11/40618 (2013.01); G06F 13/1636 (2013.01); G11C 11/406 (2013.01); G11C 11/409 (2013.01); G11C 11/40615 (2013.01)

(58) Field of Classification Search
CPC ............ G11C 11/40615; G11C 8/12
See application file for complete search history.

(56) References Cited

U.S. PATENT DOCUMENTS

| | | | |
|---|---|---|---|
| 6,768,694 B2 | 7/2004 | Anand et al. | |
| 7,136,320 B2 | 11/2006 | Schnabel et al. | |
| 9,432,298 B1* | 8/2016 | Smith | H04L 49/9057 |
| 9,570,147 B2 | 2/2017 | Kim | |
| 2018/0033479 A1* | 2/2018 | Lea | G11C 11/4087 |
| 2019/0172510 A1* | 6/2019 | Kim | G11C 7/222 |

FOREIGN PATENT DOCUMENTS

CN        103811047        1/2017

* cited by examiner

Primary Examiner — Tuan T Nguyen
(74) Attorney, Agent, or Firm — JCIPRNET

(57) ABSTRACT

A volatile memory storage apparatus including a memory array, a refresh circuit and a pre-programmed circuit is provided. The memory array includes a plurality of memory banks. The refresh circuit is coupled to the memory array. The refresh circuit is configured to refresh the memory banks according to different refresh frequencies. The pre-programmed circuit is coupled to the refresh circuit. The pre-programmed circuit is configured to store the refresh frequencies. In addition, a refresh method of a volatile memory storage apparatus is also provided.

11 Claims, 1 Drawing Sheet

VOLATILE MEMORY STORAGE APPARATUS AND REFRESH METHOD THEREOF

CROSS-REFERENCE TO RELATED APPLICATION

This application claims the priority benefit of China application serial no. 201710945107.7, filed on Oct. 12, 2017. The entirety of the above-mentioned patent application is hereby incorporated by reference herein and made a part of this specification.

TECHNICAL FIELD

The invention is related to a memory storage apparatus and an operation method thereof, and particularly to a volatile memory storage apparatus and a refresh method thereof.

DESCRIPTION OF RELATED ART

In recent years, mobile apparatuses have become increasingly popular. Since the service life of battery of mobile apparatus needs to sustain as long as possible, the power consumption requirement of the electronic device therein needs to be as low as possible. For conventional volatile memory (e.g., dynamic random access memory (DRAM)), the power consumption for self-refresh current is required to be low enough to meet the need of mobile apparatus. In known technologies, many technical solutions that reduce self-refresh current have been developed; however, the technical solutions have their advantages and disadvantages. Although they reduce self-refresh current, other issues have be raised. Therefore, it is an important issue for persons skilled in the art to find out how to reduce the self-refresh current of memory apparatus without affecting other properties.

SUMMARY OF INVENTION

The invention provides a volatile memory storage apparatus and a refresh method thereof, and the memory bank thereof has different refresh frequencies, which helps to reduce self-refresh current.

In the invention, a volatile memory storage apparatus includes a memory array, a refresh circuit and a pre-programmed circuit. The memory array includes a plurality of memory banks. The refresh circuit is coupled to the memory array. The refresh circuit is configured to refresh the memory bank according to different refresh frequencies. The pre-programmed circuit is coupled to the refresh circuit. The pre-programmed circuit is configured to store refresh frequencies.

In the invention, a refresh method of a volatile memory storage apparatus includes: determining data retention of each of memory banks; setting a plurality of different refresh frequencies according to a determination result; and refreshing the memory banks according to different refresh frequencies. There is a multiple relationship between the refresh frequencies.

In summary, in the exemplary embodiment of the invention, the refresh circuit refreshes the memory bank according to different refresh frequencies, which can reduce the self-refresh current of volatile memory storage apparatus.

In order to make the aforementioned features and advantages of the invention more comprehensible, embodiments accompanying figures are described in detail below.

DESCRIPTION OF EMBODIMENTS

Embodiments are provided below to describe the invention in detail, though the invention is not limited to the provided embodiments. Similarly, the provided exemplary embodiments can be suitably combined. The term "coupling/coupled" used in this specification (including claims) of the present application may refer to any direct or indirect connection means. For example, "a first device is coupled to a second device" should be interpreted as "the first device is directly connected to the second device" or "the first device is indirectly connected to the second device through other devices or connection means." In addition, the term "signal" can refer to a current, a voltage, a charge, a temperature, data, electromagnetic wave or any one or multiple signals.

Figure 1:
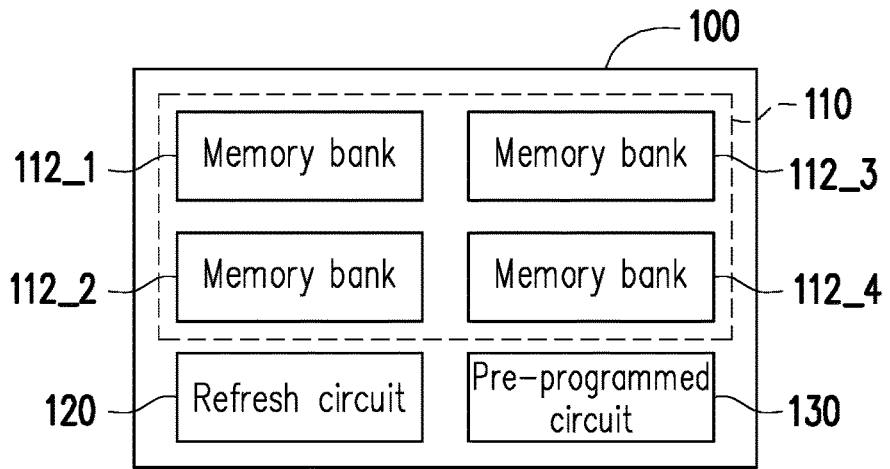
FIG. 1 is a schematic view illustrating a volatile memory storage apparatus according to an embodiment of the invention.

Referring to FIG. 1, a volatile memory storage apparatus 100 in the embodiment is, for example, a dynamic random access memory, including a memory array 110, a refresh circuit 120 and a pre-programmed circuit 130. The refresh circuit 120 is coupled to the memory array 110. The pre-programmed circuit 130 is coupled to the refresh circuit 120. In the embodiment, the memory array 110, the refresh circuit 120 and the pre-programmed circuit 130 may be implemented via any suitable circuit structure in the technical field; the invention provides no limitation thereto. The implementation method thereof may be derived from sufficient teaching, suggestions and implementations provided by ordinary knowledge in the technical field.

In the embodiment, the memory array 110 is divided into a plurality of memory banks 112_1, 112_2, 112_3 and 112_4. The number of the memory banks is described for exemplary purpose only but does not serve as a limitation to the invention. In the embodiment, the size of the memory banks 112_1, 112_2, 112_3 and 112_4 may be the size of any dividable memory banks. The pre-programmed circuit 130 pre-stores different refresh frequencies. The refresh circuit 120 reads refresh frequency from the pre-programmed circuit 130, and refreshes memory banks 112_1, 112_2, 112_3 and 112_4 according to different refresh frequencies. Specifically, in a testing stage, a test machine performs test on data retention of each of the memory banks, therefore, which means that the memory bank with stronger data retention can be refreshed after a longer time. For example, in a wafer testing stage, the test result shows that a portion of cells in the memory bank 112_1 has weaker data retention, which means that, as compared with the other memory banks 112_2, 112_3 and 112_4, the memory bank 112_1 needs to be refreshed more frequently. For example, the refresh circuit 120 refreshes the memory bank 112_1 at a refresh frequency (first refresh frequency=1/64 ms, i.e., refreshed one time every 64 milliseconds) of every 64 milliseconds, and the refresh circuit 120 refreshes at least one of the memory banks 112_2, 112_3 and 112_4 at the refresh frequency (second refresh frequency) of 128 milliseconds. The above-mentioned refresh frequencies are in a multiple relationship; in other words, the second refresh frequency is two times the first refresh frequency. When it comes to choosing the multiple relationship, while refreshing the memory banks 112_2, 112_3 and 112_4, the refresh circuit 120 may determine whether to refresh the memory bank 112_1 together at the time of refreshing the memory bank 112_1 according to the multiple at which the memory bank is refreshed, or choose to skip the current refresh operation. In an embodiment, the refresh frequency of the memory bank 112_1 may be set as 80 milliseconds; the refresh frequency of the memory banks 112_2, 112_3 and 112_4 may be set as 160 milliseconds. In the exemplary embodiment of the invention, the value as well as magnification of the first refresh frequency and the second refresh frequency are described for exemplary purpose only, which should not be construed as a limitation to the invention.

Therefore, in the embodiment, the refresh frequency of one memory bank 112_1 among the memory banks 112_1, 112_2, 112_3 and 112_4 is different from the refresh frequency of the other memory banks 112_2, 112_3 and 112_4. In an embodiment, the refresh frequency of the memory banks 112_2, 112_3 and 112_4 may be the same or different. In the embodiment, the refresh frequency of the memory bank 112_1 with weaker data retention may be set as the predetermined frequency value, and the refresh frequency of the other memory banks 112_2, 112_3 and 112_4 in the memory array 110 is no higher than the predetermined frequency value.

In the embodiment, the pre-programmed circuit 130 includes an electronic fuse or a metal fuse which is fusible by laser. In the test stage, the test machine performs test on the data retention of each of the memory banks, determines the refresh frequency of each of the memory banks, and stores the refresh frequencies in the pre-programmed circuit 130.

In an embodiment, there may be a plurality of memory banks having a first refresh frequency. For example, the refresh circuit 120 refreshes the memory banks 112_1 and 112_2 at the first refresh frequency, and the refresh circuit 120 refreshes the memory banks 112_3 and 112_4 at a second refresh frequency. The invention provides no particular limitation to the number of the memory bank having the same refresh frequency.

In the embodiment, a refresh method of a volatile memory storage apparatus is at least used for, for example, the volatile memory storage apparatus 100 in the embodiment of FIG. 1. In step S100, a memory controller (not shown) divides the memory array 100 into a plurality of memory banks 112_1, 112_2, 112_3 and 112_4. In step S110, the memory controller or test machine (not shown) determines the data retention of each of the memory banks 112_1, 112_2, 112_3 and 112_4. In an embodiment, the memory controller or test machine, for example, labels the data retention of each of the memory banks or classifies the data retention, and determines the level of data retention to which each of the memory banks belongs to. In step S120, the memory controller or test machine (not shown) in the pre-programmed circuit 130 sets a plurality of different refresh frequencies according to a determination result. The refresh frequencies are, for example, in a multiple relationship. In step S130, the refresh circuit 120 refreshes the memory banks according to different refresh frequencies. For example, the refresh circuit 120 refreshes one or more first memory banks according to the first refresh frequency, and refreshes one or more second memory banks according to a second refresh frequency different from the first refresh frequency.

In addition, the refresh method of the volatile memory storage apparatus in the embodiment may be derived from sufficient teaching, suggestions and implementation provided by the descriptions in the embodiment of FIG. 1, and thus no further descriptions are incorporated herein.

Figure 2:
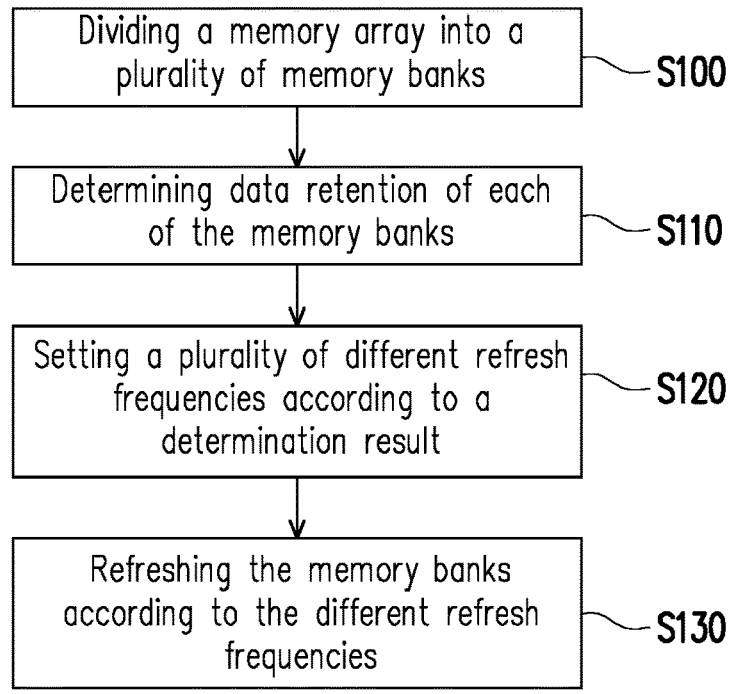
FIG. 2 is a flowchart illustrating a refresh method of a volatile memory storage apparatus according to an embodiment of the invention.

As a part of a system, the memory storage apparatus (e.g., dynamic random access memory (DRAM)) can perform the refresh operation or adjust the refresh frequency thereof, that is, auto-refresh operation, via an external controller or a control signal while performing reading and writing operations. Additionally, the refresh operation may be self-refresh operation. The refresh method of the memory storage apparatus in FIG. 2 is, for example, self-refresh operation performed within the memory storage apparatus after the memory storage apparatus enters a sleep mode.

In summary, in the exemplary embodiment of the invention, the refresh circuit refreshes memory banks according to different refresh frequencies. The memory bank with weaker data retention is refreshed at a higher frequency, and the memory bank with stronger data retention is refreshed at a lower frequency so as to reduce self-refresh current of the volatile memory storage apparatus. Moreover, in the exemplary embodiment of the invention, since the refresh frequency required by each of the memory banks in the memory chip may be different, the refresh frequency of memory banks may be customized according to actual need of design. In other words, the refresh frequency of each of the memory banks in the memory chip may be adjusted to be different from each other.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A volatile memory storage apparatus, comprising:
a memory array, comprising a plurality of memory banks;
a refresh circuit, coupled to the memory array, configured to refresh the memory banks according to different refresh frequencies; and
a pre-programmed circuit, coupled to the refresh circuit, configured to store the refresh frequencies.

2. The volatile memory storage apparatus according to claim 1, wherein a refresh frequency of at least one memory bank of the memory banks is different from a refresh frequency of the other memory banks of the memory banks.

3. The volatile memory storage apparatus according to claim 2, wherein the memory banks comprise one or more first memory banks and one or more second memory banks, the refresh frequencies comprise a first frequency and a second frequency, and the refresh circuit refreshes the one or more first memory banks according to the first refresh frequency, and the refresh circuit refreshes the one or more second memory banks according to the second refresh frequency, wherein the first frequency and the second frequency are different.

4. The volatile memory storage apparatus according to claim 1, wherein the pre-programmed circuit comprises one of an electronic fuse and a metal fuse fusible by laser.

5. The volatile memory storage apparatus according to claim 1, wherein the refresh frequencies are no higher than a predetermined frequency value.

6. The volatile memory storage apparatus according to claim 1, wherein the refresh frequencies are in a multiple relationship.

7. A refresh method of a volatile memory storage apparatus, wherein the volatile memory storage apparatus comprises a memory may, and the memory array comprises a plurality of memory banks, the refresh method comprising:
  determining a data retention according to each of the memory banks;
  setting a plurality of different refresh frequencies according a determination result, wherein the refresh frequencies are in a multiple relationship; and
  refreshing the memory banks according to the different refresh frequencies.

8. The refresh method of the volatile memory storage apparatus according to claim 7, wherein a refresh frequency of at least one memory bank of the memory banks is different from a refresh frequency of the other memory banks of the memory banks.

9. The refresh method of the volatile memory storage apparatus according to claim 8, wherein the memory banks comprise one or more first memory banks and one or more second memory banks, the refresh frequencies comprise a first frequency and a second frequency, wherein the first frequency and the second frequency are different, and the step of refreshing the memory banks according to the different refresh frequencies comprises:
  refreshing the one or more first memory banks according to the first refresh frequency; and
  refreshing the one or more second memory banks according to the second refresh frequency.

10. The refresh method of the volatile memory storage apparatus according to claim 7, further comprising: dividing the memory array into the memory banks.

11. The refresh method of the volatile memory storage apparatus according to claim 7, wherein the refresh frequencies are no higher than a predetermined frequency value.

* * * * *